(12) United States Patent
Kang et al.

(10) Patent No.: US 7,724,560 B2
(45) Date of Patent: May 25, 2010

(54) NONVOLATILE MEMORY DEVICE HAVING TWIN MEMORY CELLS

(75) Inventors: Sang-Beom Kang, Hwaseong-si (KR); Woo-Yeong Cho, Suwon-si (KR); Hyung-Rok Oh, Yongin-si (KR); Joon-Min Park, Dongjak-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 198 days.

(21) Appl. No.: 12/107,985

(22) Filed: Apr. 23, 2008

(65) Prior Publication Data
US 2008/0273365 A1 Nov. 6, 2008

(30) Foreign Application Priority Data
May 1, 2007 (KR) .................. 10-2007-0042383

(51) Int. Cl.
*G11C 5/06* (2006.01)
(52) U.S. Cl. ........................ 365/63; 365/148
(58) Field of Classification Search .......... 365/63, 365/148, 72
See application file for complete search history.

(56) References Cited

U.S. PATENT DOCUMENTS

| | | | | |
|---|---|---|---|---|
| 6,809,963 | B2* | 10/2004 | Kanai | 365/185.05 |
| 7,035,139 | B2 | 4/2006 | Uesugi et al. | |
| 2005/0018479 | A1 | 1/2005 | Uesugi et al. | |
| 2005/0041457 | A1* | 2/2005 | Forbes | 365/149 |
| 2005/0231992 | A1 | 10/2005 | Rinerson et al. | |
| 2006/0203541 | A1* | 9/2006 | Toda | 365/163 |

FOREIGN PATENT DOCUMENTS

| | | |
|---|---|---|
| JP | 2005044950 | 2/2005 |
| KR | 1020060119109 | 11/2006 |

* cited by examiner

*Primary Examiner*—Vu A Le
(74) *Attorney, Agent, or Firm*—Volentine & Whitt, P.L.L.C.

(57) ABSTRACT

A nonvolatile memory device includes multiple first bit lines extending in a first direction, multiple word lines formed on the first bit lines and extending in a second direction different from the first direction, and multiple second bit lines, formed on the word lines and extending in the first direction. The nonvoliative memory device also includes multiple twin memory cells, each of which includes a first memory cell coupled between a first bit line and a word line and a second memory cell coupled between the word line and a second bit line. The first and second memory cells store different data.

22 Claims, 11 Drawing Sheets

NONVOLATILE MEMORY DEVICE HAVING TWIN MEMORY CELLS

CROSS REFERENCE TO RELATED APPLICATION

A claim of priority is made to Korean Patent Application No. 10-2007-0042383, filed on May 1, 2007, in the Korean Intellectual Property Office, the subject matter of which is hereby incorporated by reference.

BACKGROUND OF THE INVENTION

1. Field of the Invention

The present invention relates to a nonvolatile memory device, and more particularly, to a nonvolatile memory device having twin memory cells.

2. Description of the Related Art

Nonvolatile memory devices using resistance materials include Resistive Random Access Memory (RRAM), Phase-change RAM (PRAM), and Magnetic RAM (MRAM). Dynamic RAM (DRAM) and flash memory devices store data using charges. Nonvolatile memory devices using resistance materials may store data using the resistance change of variable resistive elements (for example, RRAM), phase change of phase change materials, such as chalcogenide alloy (for example, PRAM), and resistance change of Magnetic Tunnel Junction (MTJ) thin films according to the magnetization state of a ferromagnetic substance.

More particularly, a resistance memory cell includes a variable resistive element between an upper electrode and a lower electrode, and the resistance level of the variable resistive element may be changed according to a voltage supplied to the upper and lower electrodes. The state where the variable resistive element has a high resistance is defined as high resistance data, which is reset data (1), and the state where the variable resistive element has a low resistance is defined as low resistance data, which is set data (0).

SUMMARY OF THE INVENTION

The various embodiments should not be construed as being limited to a particular objective, and various features and advantages of the embodiments will be apparent to those having ordinary skill in the art based on the following description.

According to an aspect of the present invention, there is provided a nonvolatile memory device including multiple first bit lines extending in a first direction; multiple word lines, formed on the first bit lines, extending in a second direction different from the first direction; and multiple second bit lines, formed on the word lines, extending in the first direction. The nonvolatile memory device also includes multiple twin memory cells, each of which includes a first memory cell coupled between the first bit line and the word line, and a second memory cell coupled between the word line and the second bit line. The first and second memory cells store different data. Further, each of the first and second memory cells may include a variable resistive element and a bi-directional access element.

According to another aspect of the present invention, there is provided a nonvolatile memory device including a stacked memory cell array, a selection circuit, a write circuit and a read circuit. The stacked memory cell array includes vertically stacked memory cell layers, each of the memory cell layers including multiple twin memory cells, and each of the twin memory cells including a first memory cell and a second memory cell which store different data. The selection circuit selects a twin memory cell to be written to or read from among the twin memory cells of at least one of the memory cell layers. The write circuit writes data to the selected twin memory cell, and the read circuit which reads data from the selected twin memory cell.

BRIEF DESCRIPTION OF THE DRAWINGS

The embodiments of the present invention will be described with reference to the attached drawings in which.

DETAILED DESCRIPTION OF THE EMBODIMENTS

Figure 1:
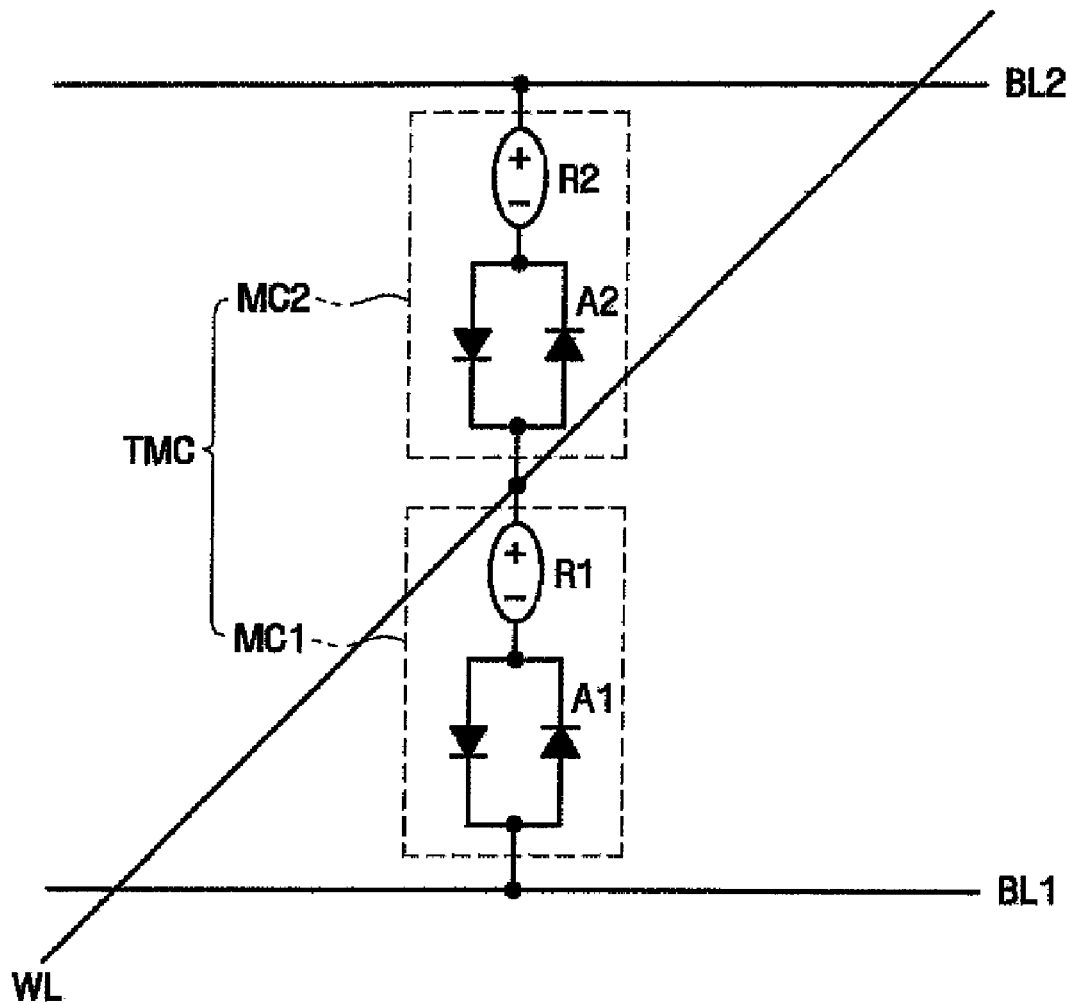
FIGS. 1 and 2 are circuit diagrams illustrating twin memory cells in a nonvolatile memory device, according to exemplary embodiments of the present invention.

The present invention will now be described more fully with reference to the accompanying drawings, in which exemplary embodiments of the invention are shown. The present invention may, however, be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

In the following description, it will be understood that when an element is referred to as being "connected to" or "coupled to" another element, it may be directly connected to or coupled to the other element or intervening elements may also be present. In contrast, when an element is referred to as being "directly connected to" or "directly coupled to" another element, there are no intervening elements present. The terms "and/or" comprise each and at least one combination of referenced items.

Although terminology such as "the first" and "the second" are used to describe various elements, components, and/or sections, such elements, components, and/or sections are not limited to the terminology. Such terminology is used to distinguish one element, component, and/or section from another element, component, and/or section. Therefore, the first element, the first component, and the first section mentioned in the present disclosure may be the second element, the second component, and the second section within the technical concept.

As used herein, certain terminologies are used to explain the exemplary embodiments. It is understood that these terminologies are not limiting. Unless specifically stated, a word in singular form also represents plural form. The terms "comprise" and/or "comprising" used in the specification may include elements, steps, operations and/or devices specifically mentioned in the specification, as well as other elements, steps, and operations, and/or devices.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As shown in the drawings, space-related terminologies, such as "below," "beneath," "lower," "above," and "upper" are intended to be used to aid the understanding of the relationship between elements. Spatially-related terminology is to be considered in the context of the direction specified in associated drawings. In addition, it is to be understood in the context of two different directions of an element when the element is in use or operation. For example, if an element shown in a drawing is flipped in the vertical direction, the element which is described as "below" or "beneath" another element will now be "above" the other element. Therefore, the exemplary terminology "below" can include both below and above relationships. An element can also be positioned in different relative directions, and as a result spatially-related terminologies may be interpreted differently, depending on the relative position of an element.

Hereinafter, although exemplary embodiments of the present invention will be described as using a resistive RAM (RRAM), the various embodiments of the present invention may be applied to all kinds of nonvolatile memory devices using a resistive element, such as phase change random access memories (PRAM), ferroelectric RAMs (FRAM), and magnetic RAMs (MRAM).

Figure 2:
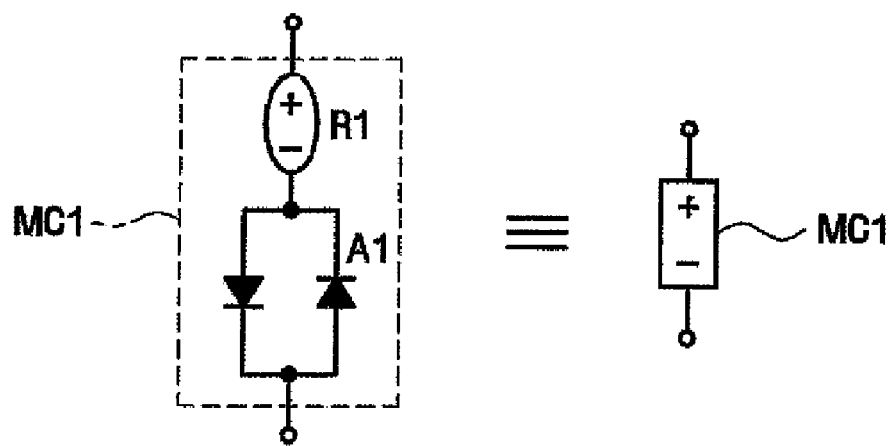
Figure 3:
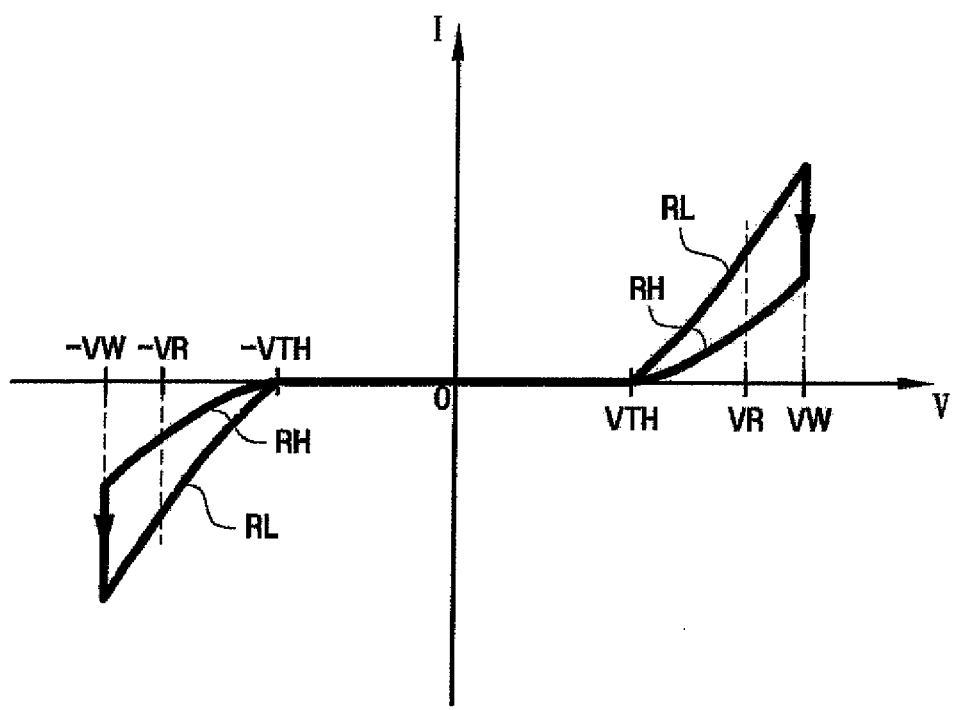
FIG. 3 is a graph illustrating operations of a twin memory cell in a nonvolatile memory device, according to exemplary embodiments of the present invention.

FIGS. 1 and 2 are circuit diagrams illustrating a twin memory cell formed in a nonvolatile memory device, according to exemplary embodiments of the present invention. FIG. 3 is a graph illustrating operations of a twin memory cell formed in a nonvolatile memory device, according to exemplary embodiments of the present invention.

Referring to FIG. 1, a twin memory cell TMC is a pair of memory cells, including a first memory cell MC1 and a second memory cell MC2. The first memory cell MC1 is coupled in between a first bit line BL1 and a word line WL, and the second memory cell MC2 is coupled in between the word line WL and a second bit line BL2.

Each of the first and the second memory cells MC1, MC2 include variable resistive elements R1, R2 and bi-directional access elements A1, A2. For example, the variable resistive elements R1, R2 can include perovskite. Perovskite may be made using compositions such as manganite including $Pr_{0.7}Ca_{0.3}MnO_3$, $Pr_{0.5}Ca_{0.5}MnO_3$, PCMO, or LCMO, titanate (STO:Cr), and zirconate including SZO:Cr, $Ca_2Nb_2O_7$:Cr, or $Ta_2O_5$:Cr. Although perovskite is used as an example of the variable resistance elements R1, R2, the variable resistance elements are not limited to perovskite.

Each of the variable resistive elements R1, R2 may have a corresponding polarity, and the polarities may be in the same direction. For example, an upper end part of the variable resistive elements R1, R2 can have a first polarity (for example, positive +) and a lower part can have a second polarity (for example, negative −). The exemplary configuration of FIG. 3 shows the variable resistive element R1 having the first polarity (+) in the direction of the word line WL and the second polarity (−) in the direction of the first bit line BL1, and the variable resistive element R2 having the first polarity (+) in the direction of the second bit line BL2 and the second polarity (−) in the direction of the word line WL. Note that an anode (+) and a cathode (−) can change depending on the definitions. In this description, reset data of the variable resistive elements R1, R2 is written when voltage of the anode (+) is higher than voltage of the cathode (−).

The bi-directional access elements A1, A2 enable current passing through the variable resistive elements R1, R2 to flow bi-directionally (for example, upper to lower direction or lower to the upper direction). The bi-directional access elements A1, A2 may be two diodes, for example, coupled in opposite directions from each other, as illustrated in FIG. 3.

The first and second memory cells MC1, MC2 can store different data. As a result, when data is read from one memory cell (for example, MC1), data stored in the other memory cell (for example, MC2) may be used as reference. Hence, the reliability of the read operation is improved. Depending on various designs, either the first memory cell MC1 or the second memory cell MC2 may be used as reference for the other memory cell.

FIG. 2 shows one memory cell (for example, the first memory cell MC1) in simplified form for the sake of convenience. Also, the polarity of memory cell, such as the first memory cell MC1, is intended to refer to the polarity of variable resistive element R1 included in the memory cell, for the sake of convenience.

The operation of the each memory cell (MC1 or MC2) of the twin memory cell TMC is described with reference to FIGS. 1 and 3.

A write operation is described as follows. When a difference between voltage applied to a first electrode (+) and voltage applied to a second electrode (−) of the memory cell MC1, MC2 becomes greater than or equal to a critical write voltage VW, data is written simultaneously to each of the memory cells MC1, MC2.

When the voltage applied to the first electrode (+) is higher than the voltage applied to the second electrode (−), reset data (high resistance state) is written. Referring to a first quadrant of FIG. 3, a low resistance state RL becomes a high resistance state RH when the voltage applied to the first electrode (+) minus the voltage applied to the second electrode (−) becomes VW. Also, when the voltage applied to the first electrode (+) is lower than the voltage applied to the second electrode (−), set data (low resistance state) is written. Referring to a third quadrant of FIG. 3, a high resistance state RH becomes a low resistance state RL when the voltage applied to the first electrode (+) minus the voltage applied to the second electrode (−) becomes −VW.

A read operation is described as follows. When the difference between the voltage applied to the first electrode (+) and the voltage applied to the second electrode (−) of the memory cell MC1, MC2 becomes the read threshold voltage VR, data stored in the each memory cell MC1, MC2 may be read. In this case, the read voltage VR may be greater than threshold voltage VTH and less than the critical write voltage VW. In this description, data stored in each memory cell MC1, MC2 may be read either when the voltage applied to the first electrode (+) is greater than the voltage applied to the second electrode (−) or when the voltage applied to the first electrode (+) is less than the voltage applied to the second electrode (−).

Referring to the first quadrant of FIG. 3, a high resistance state RH and a low resistance state RL are separately identifiable when the voltage applied to the first electrode (+) minus the voltage applied to the second electrode (−) is VR. Likewise, referring to the third quadrant of FIG. 3, the high resistance state RH and the low resistance state RL are separately identifiable when the voltage applied to the first electrode (+) minus the voltage applied to the second electrode (−) is −VR.

Figure 4:
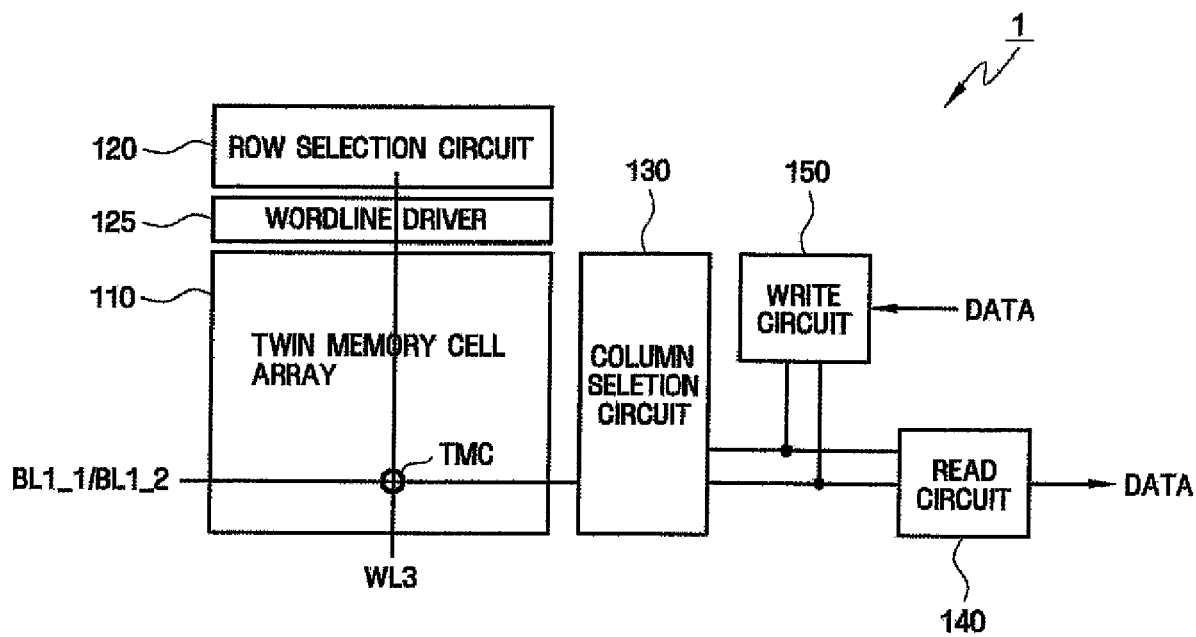
FIG. 4 is a block diagram illustrating a nonvolatile memory device, according to an exemplary embodiment of the present invention.
Figure 5:
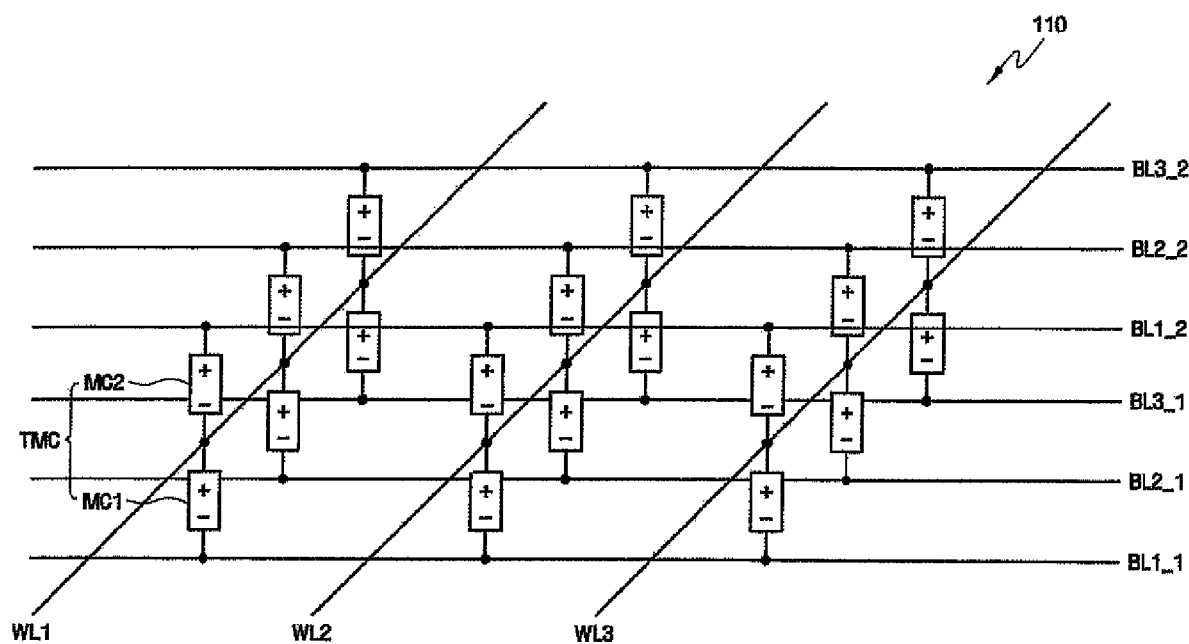
FIG. 5 is a block diagram illustrating a twin memory cell array in FIG. 4, according to an exemplary embodiment of the present invention.

FIG. 4 is a block diagram illustrating a nonvolatile memory device, according to an exemplary embodiment of the present invention. FIG. 5 is a block diagram illustrating a twin memory cell array in FIG. 4, according to an exemplary embodiment of the present invention.

Referring to FIG. 4, a nonvolatile memory device 1, according to an exemplary embodiment of the present invention, includes a twin memory cell array 110, a row selection circuit 120, a column selection circuit 130, a write circuit 150, a read circuit 140, and a word line driver 125.

The twin memory cell array 110 may include a cross point structure as shown in FIG. 5, for example. The cross point structure is a structure having one memory cell in the area where one line crosses another line. More specifically, the twin memory cell array 110 may include multiple first bit lines BL1_1, BL2_1, BL3_1, multiple word lines WL1, WL2, WL3, multiple second bit lines BL1_2, BL2_2, BL3_2, and multiple twin memory cells TMC. The multiple first bit lines BL1_1, BL2_1, BL3_1 extend substantially parallel to one another in a first direction. The multiple word lines WL1, WL2, WL3 are formed on the multiple first bit lines BL1_1, BL2_1, BL3_1 substantially parallel to one another and extend in a second direction, different from the first direction. The multiple second bit lines BL1_2, BL2_2, BL3_2 are formed on the multiple word lines WL1, WL2, WL3 and likewise extend in the first direction. Each twin memory cell TMC includes a first memory cell MC1, which is coupled in between first bit lines BL1_1, BL2_1, BL3_1 and word lines WL1, WL2, WL3, respectively, and a second memory cell MC2, which is coupled between the word lines WL1, WL2, WL3 and the second bit lines BL1_2, BL2_2, BL3_2, respectively.

The polarity of the first and second memory cells MC1, MC2 of each twin memory cell TMC may be the same. A first polarity (for example, an anode (+)) may be on an upper end of the first and the second memory cells MC1, MC2, and a second polarity (for example, a cathode (−)) may be on an opposite, lower end of the first and the second memory cells MC1, MC2. Alternatively, the first polarity (for example, an anode (+)) may be on the lower end of the first and the second memory cells MC1, MC2, and the second polarity (for example, a cathode (−)) may be on the opposite, upper end of the first and the second memory cells MC1, MC2.

Referring to FIG. 4, among the twin memory cells TMC, a twin memory cell TMC for writing or reading may be selected by having the row selection circuit 120 select the word line (for example, WL3) and the column selection circuit 130 select the bit line (for example, BL1_1, BL1_2).

The word line driver 125 is coupled with the multiple word lines WL1, WL2, WL3 and controls a voltage level of the word lines WL1, WL2, WL3. The write circuit 150 is coupled with the multiple first bit lines BL1_1, BL2_1, BL3_1 and the second bit lines BL1_2, BL2_2, BL3_2, and writes data to the twin memory cell TMC selected by the selection circuits 120, 130. The write methods are described in more detail below, e.g., referring to FIGS. 6A, 6B, 8A, 8B, 10A, and 10B.

The read circuit 140 is coupled with the multiple first bit lines BL1_1, BL2_1, BL3_1 and the second bit lines BL1_2, BL2_2, BL3_2, and reads data from the twin memory cell TMC selected by the selection circuits 120, 130. The read methods are described in more detail below, referring to FIGS. 7A, 7B, 9A, 9B, 11A, and 11B.

Figure 6A:
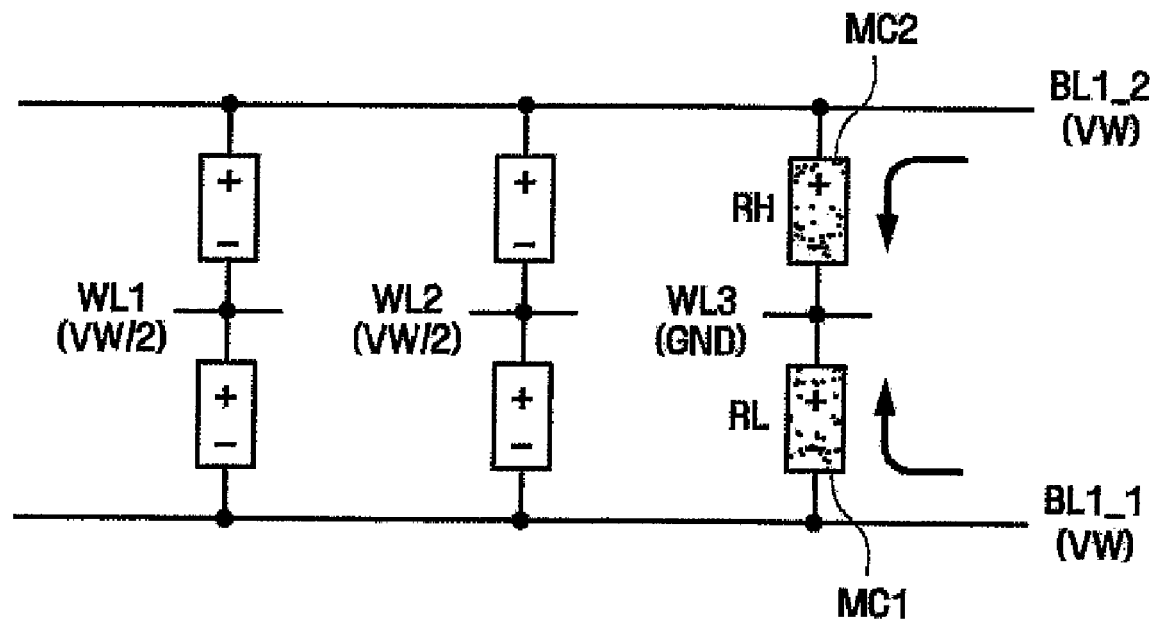
FIGS. 6A and 6B are conceptual views illustrating writing methods of a nonvolatile memory device, according to an exemplary embodiment of the present invention.
Figure 6B:
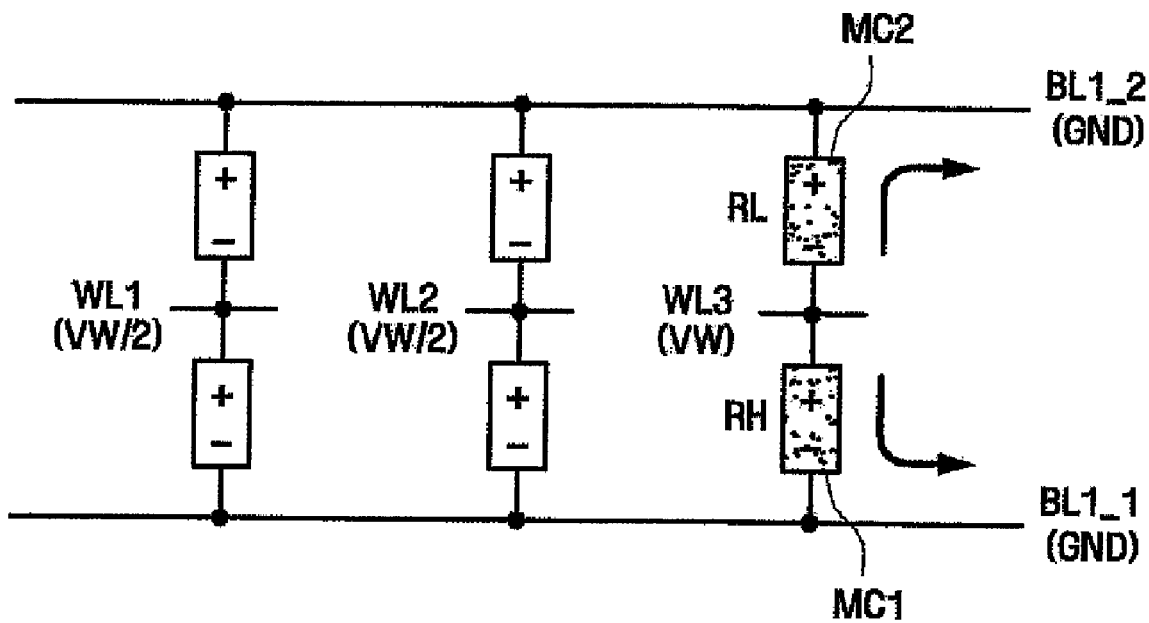
Figure 7A:
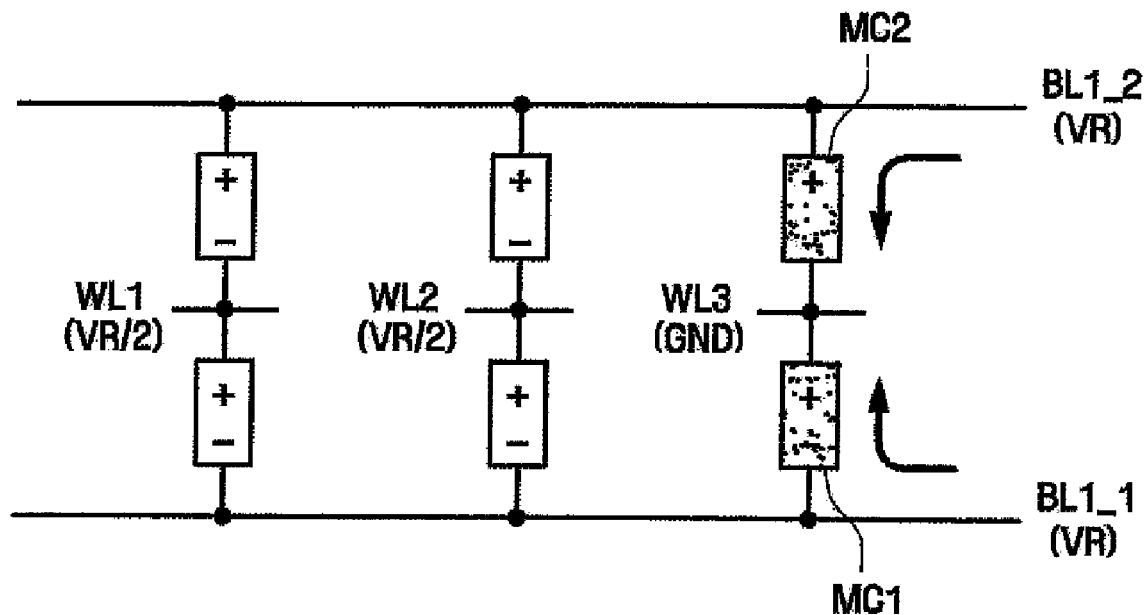
FIGS. 7A and 7B are conceptual views illustrating reading methods of a nonvolatile memory device, according to an exemplary embodiment of the present invention.
Figure 7B:
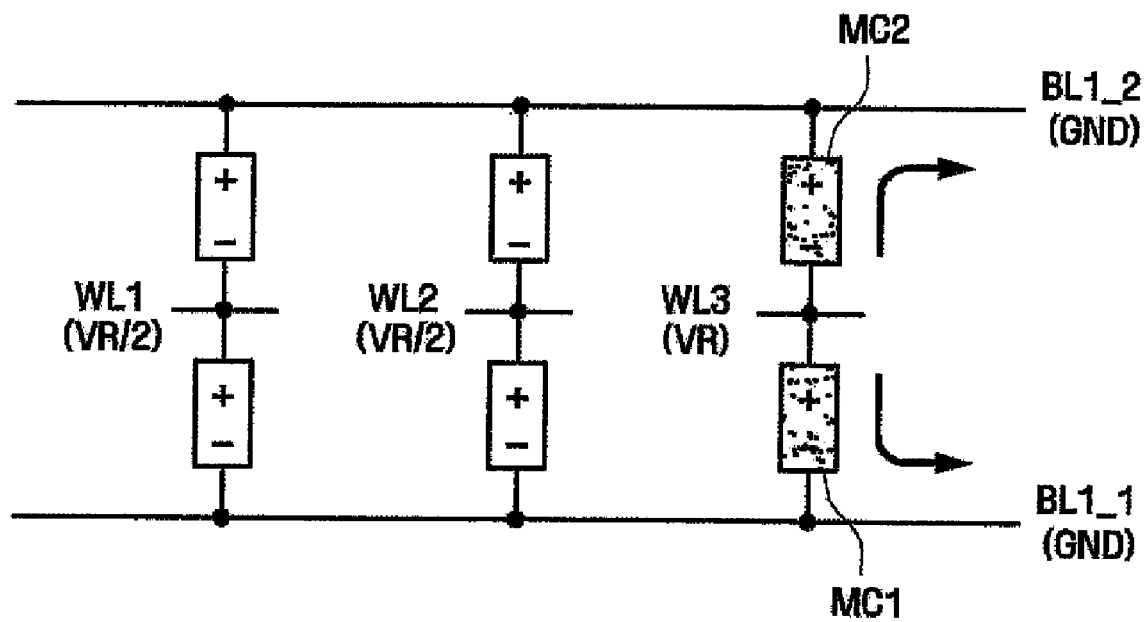

FIGS. 6A and 6B are conceptual views illustrating a writing method of a nonvolatile memory device according to an exemplary embodiment of the present invention. FIGS. 7A and 7B are conceptual views illustrating a reading method of a nonvolatile memory device according to an exemplary embodiment of the present invention. To aid in understanding, the selected twin memory cells of FIGS. 6A through 7B are indicated by dots.

Referring to FIGS. 3, 4 and 6A, the write circuit 150 supplies the first bit line BL1_1 and the second bit line BL1_2, which are coupled with the selected twin memory cell TMC, with a first write voltage (for example, VW) and a second write voltage (for example, VW), respectively. Also, the word line driver 125 supplies the word line WL3 coupled with the selected twin memory cell TMC with the first voltage (for example, GND). As a result, set data is written to the first memory cell MC1 since GND and VW are supplied to the first electrode (+) and the second electrode (−) of the first memory cell MC1, respectively. In contrast, reset data is written into the second memory cell MC2, since VW and GND are supplied to the first electrode (+) and the second electrode (−) of the second memory cell MC2, respectively.

VW is used as an example of the first and second write voltages. It is understood, however, that any positive voltage may be used as the first and second write voltages, as long as a level difference between the first write voltage and the first voltage, and a level difference between the second write voltage and the first voltage, is greater than or equal to the critical write voltage VW.

Also, the word line driver 125 supplies the word lines WL1, WL2, which are coupled with the non-selected twin memory cells, with the second voltage (for example, VW/2), where the voltage difference between the first write voltage and the second voltage and the voltage difference between the second write voltage and the second voltage is less than the critical write voltage VW. As a result, data is not written to the non-selected twin memory cells.

Referring to FIGS. 3, 4, and 6B, the write circuit 150 supplies the first bit line BL1_1 and the second bit line BL1_2, which are coupled with the selected twin memory cell TMC, with the first write voltage (for example, GND) and the second write voltage (for example, GND), respectively. Also, the word line driver 125 supplies the word line WL3 coupled with the selected twin memory cell TMC with the first voltage (for example, VW). As a result, reset data is written into the first memory cell MC1, since VW and GND are supplied to the first electrode (+) and the second electrode (−) of the first memory cell MC1, respectively. In contrast, set data is written into the second memory cell MC2 since GND and VW are supplied to the first electrode (+) and the second electrode (−) of the second memory cell MC2, respectively.

VW is used as an example of the first voltage. It is understood, however, that any positive voltage may be used as the first voltage, as long as the level difference between the first write voltage and the first voltage, and the level difference between the second write voltage and the first voltage, is greater than or equal to the critical write voltage VW.

Also, the word line driver 125 supplies the word lines WL1, WL2 which are coupled with the non-selected twin memory cells with the second voltage (for example, VW/2), where the voltage difference between the first write voltage and the second voltage and the voltage difference between the second write voltage and the second voltage is less than the critical write voltage VW. As a result, data is not written into the non-selected twin memory cells.

Referring to FIGS. 3, 4, and 7A, the read circuit 140 supplies the first bit line BL1_1 and the second bit line BL1_2, which are coupled with the selected twin memory cell TMC, with the first read voltage (for example, VR) and the second read voltage (for example, VR), respectively. Also, the word line driver 125 supplies the word line WL3 coupled with the selected twin memory cell TMC with a third voltage (for example, GND). As a result, data may be read from the selected twin memory cell TMC.

VR is used as an example of the first and second read voltages. It is understood, however, that any positive voltage may be used as the first and second voltages, as long as a level difference between the first read voltage and the third voltage, and a level difference between the second read voltage and the third voltage is greater than the threshold voltage VTH and less than the critical write voltage VW.

In contrast, the word line driver 125 supplies the word lines WL1, WL2 which are coupled with the non-selected twin memory cells with a fourth voltage (for example, VR/2), where the voltage difference between the first read voltage and the fourth voltage and the voltage difference between the second read voltage and the fourth voltage are less than the threshold voltage VTH. As a result, data is not being read from the non-selected twin memory cells.

Referring to FIGS. 3, 4, and 7B, the read circuit 140 supplies the first bit line BL1_1 and the second bit line BL1_2, which are coupled with the selected twin memory cell TMC, with the first read voltage (for example, GND) and the second read voltage (for example, GND), respectively. Also, the word line driver 125 supplies the word line WL3 coupled with the selected twin memory cell TMC with the third voltage (for example, VR). As a result, data may be read from the selected twin memory cell TMC.

VR is used as an example of the third voltage. It is understood, however that any positive voltage may be used as the third voltage, as long as the level difference between the first read voltage and the third voltage, and the level difference between the second read voltage and the third voltage, is greater than the threshold voltage VTH and less than the critical write voltage VW.

In contrast, the word line driver 125 supplies the word lines WL1, WL2, which are coupled with the non-selected twin memory cells, with the fourth voltage (for example, VR/2), where the voltage difference between the first read voltage and the fourth voltage and the voltage difference between the second read voltage and the fourth voltage are less than the threshold voltage VTH. As a result, data is not read from the non-selected twin memory cells.

Figure 8A:
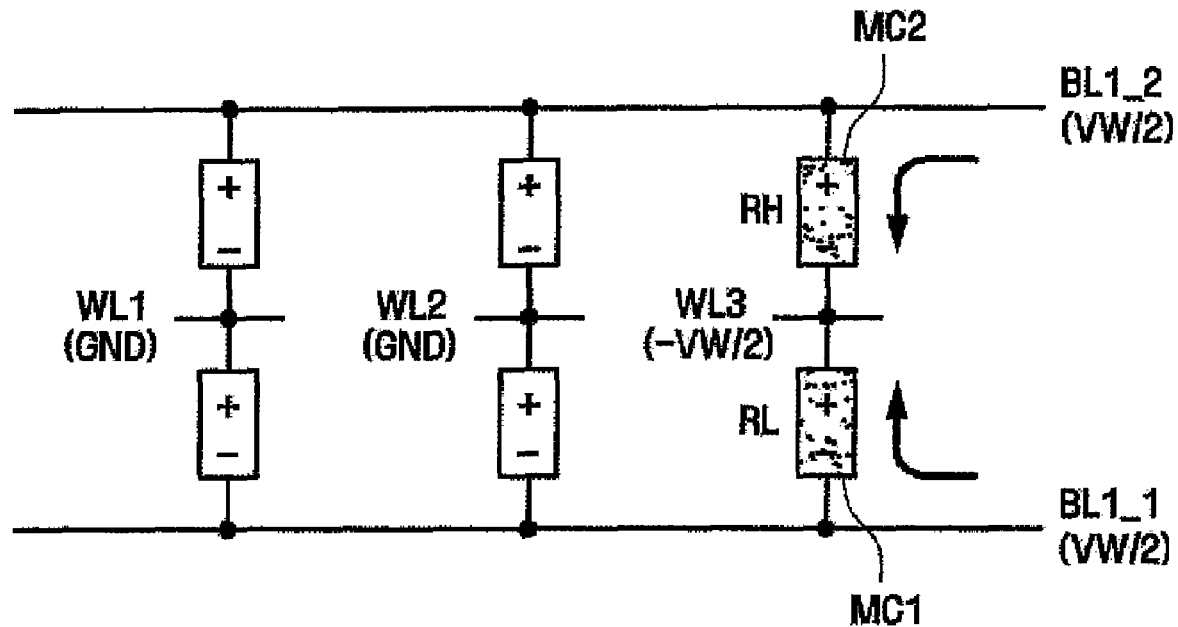
FIGS. 8A and 8B are conceptual views illustrating writing methods of a nonvolatile memory device, according to an exemplary embodiment of the present invention.
Figure 8B:
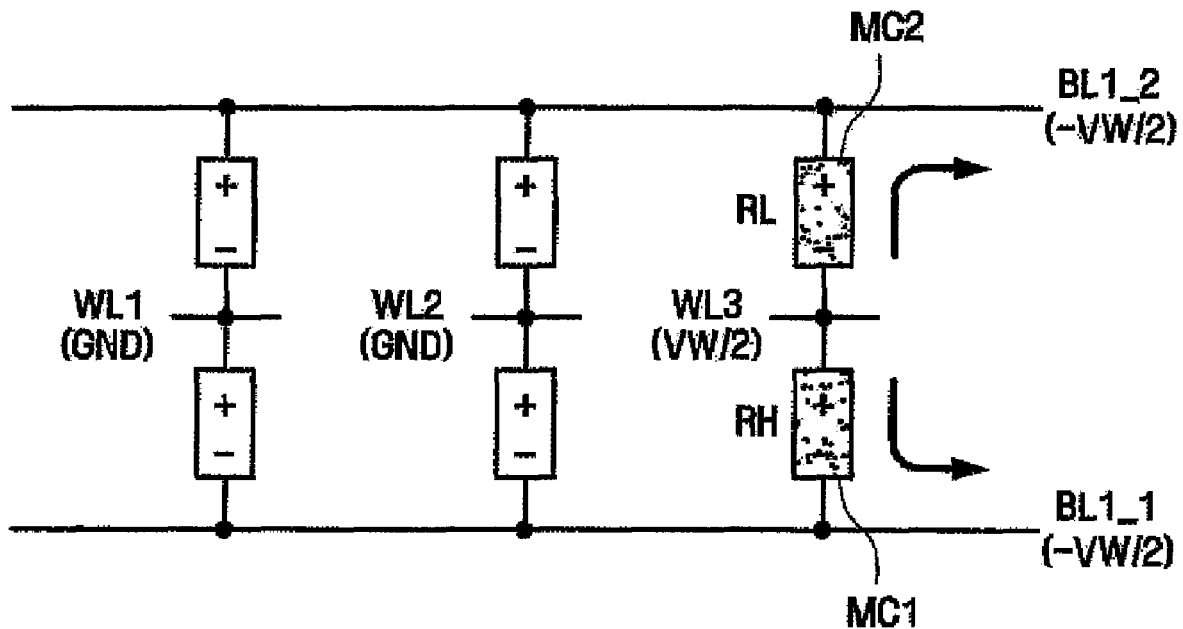
Figure 9A:
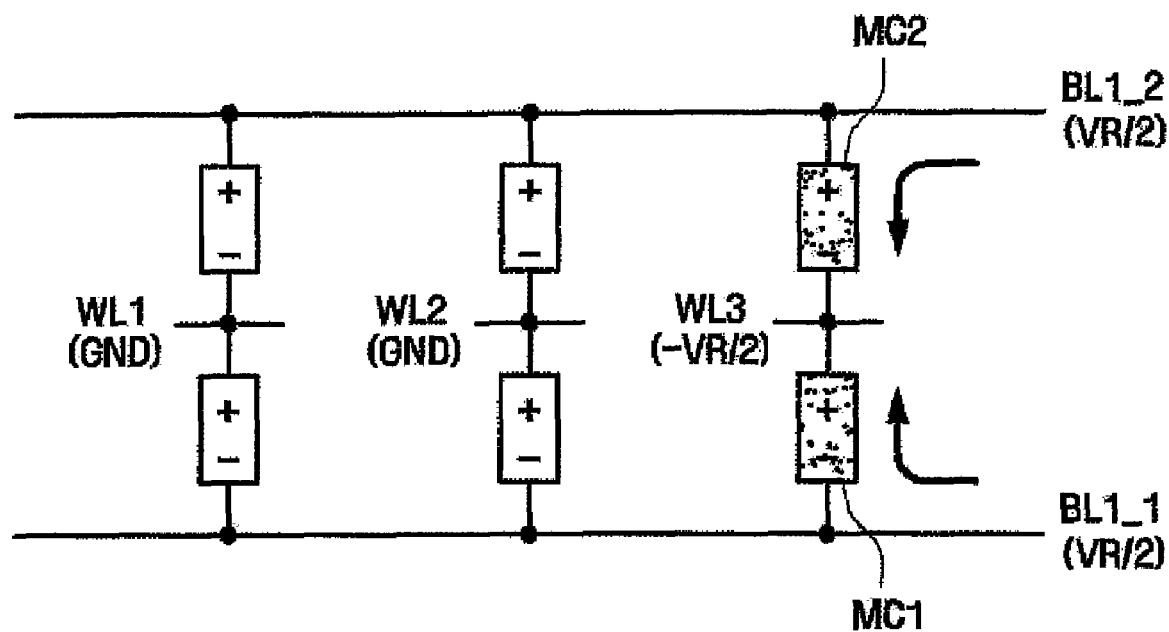
FIGS. 9A and 9B are conceptual views illustrating reading methods of a nonvolatile memory device, according to an exemplary embodiment of the present invention.
Figure 9B:
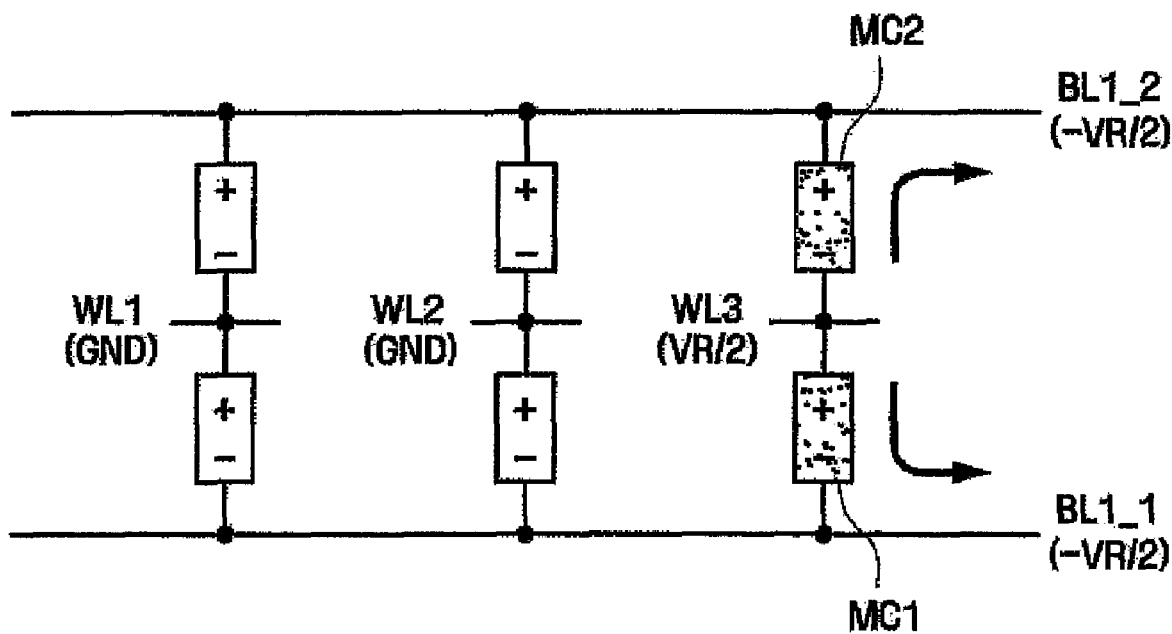

FIGS. 8A and 8B are conceptual views illustrating another writing method of the nonvolatile memory device according to an exemplary embodiment of the present invention. FIGS. 9A and 9B are conceptual views illustrating another reading method of a nonvolatile memory device according to an exemplary embodiment of the present invention. Like reference numerals refer to like elements in FIGS. 6A through 7B, and thus descriptions of these elements will not be repeated.

Referring to FIGS. 3, 4, and 8A, the write circuit 150 supplies the first bit line BL1_1 and the second bit line BL1_2, which are coupled with the selected twin memory cell TMC with the first write voltage (for example, VW/2) and the second write voltage (for example, VW/2), respectively. Also, the word line driver 125 supplies the word line WL3 coupled with the selected twin memory cell TMC with the first voltage (for example, −VW/2). As a result, set data is written into the first memory cell MC1 since −VW/2 and VW/2 are supplied to the first electrode (+) and the second electrode (−) of the first memory cell (MC1), respectively. In contrast, reset data is written into the second memory cell MC2 since VW/2 and −VW/2 are supplied to the first electrode (+) and the second electrode (−) of the second memory cell MC2, respectively.

VW/2 is used as an example of the first and second write voltages, and −VW/2 is used as an example of the first voltage. It is understood, however, that any positive voltage may be used as the first and second write voltages, and any negative voltage may be used as the first voltage, as long as a level difference between the first write voltage and the first voltage, and a level difference between the second write voltage and the first voltage, is greater than or equal to the critical write voltage VW.

Referring to FIGS. 3, 4, and 8B, the write circuit 150 supplies the first bit line BL1_1 and the second bit line BL1_2, which are coupled with the selected twin memory cell TMC, with the first write voltage (for example, −VW/2) and the second write voltage (for example, −VW/2), respectively. Also, the word line driver 125 supplies the word line WL3 coupled with the selected twin memory cell TMC with the first voltage (for example, VW/2). As a result, reset data is written into the first memory cell MC1, since VW/2 and −VW/2 are supplied to the first electrode (+) and the second electrode (−) of the first memory cell MC1, respectively. In contrast, set data is written into the second memory cell MC2 since −VW/2 and VW/2 are supplied to the first electrode (+) and the second electrode (−) of the second memory cell (MC2), respectively.

Negative VW/2 is used as an example of the first and second write voltages, and VW/2 is used as an example of the first voltage. It is understood, however, that any negative voltage may be used as the first and the second write voltages, and any positive voltage may be used as the first voltage, as long as the level difference between the first write voltage and the first voltage, and the level difference between the second write voltage and the first voltage, is greater than or equal to the critical write voltage VW.

Referring to FIGS. 3, 4, and 9A, the read circuit 140 supplies the first bit line BL1_1 and the second bit line BL1_2, which are coupled with the selected twin memory cell TMC, with the first read voltage (for example, VR/2) and the second read voltage (for example, VR/2), respectively. Also, the word line driver 125 supplies the word line WL3 coupled with the selected twin memory cell TMC with the third voltage (for example, −VR/2). As a result, data may be read from the selected twin memory cell TMC.

VR/2 is used as an example of the first and second read voltages, and −VR/2 is used as an example of the third voltage. It is understood, however, that any positive voltage may be used as the first and second read voltages, and any negative voltage may be used as the third voltage, as long as the level difference between the first read voltage and the third voltage, and the level difference between the second read voltage and the third voltage, is greater than the threshold voltage VTH and less than the critical write voltage VW.

In contrast, the word line driver 125 supplies the word lines WL1, WL2, which are coupled with the non-selected twin memory cells, with the fourth voltage (for example, GND), where the voltage difference between the first read voltage and the fourth voltage and the voltage difference between the second read voltage and the fourth voltage are less than the threshold voltage VTH. As a result, data is not read from the non-selected twin memory cells.

Referring to FIGS. 3, 4, and 9B, the read circuit 140 supplies the first bit line BL1_1 and the second bit line BL1_2, which are coupled with the selected twin memory cell TMC, with the first read voltage (for example, −VR/2) and the second read voltage (for example, −VR/2), respectively. Also, the word line driver 125 supplies the word line WL3 coupled with the selected twin memory cell TMC with the third voltage (for example, VR/2). As a result, data may be read from the selected twin memory cell TMC.

Negative VR/2 is used as an example of the first and second read voltages, and VR/2 is used as an example of the third voltage. It is understood, however, that any negative voltage may be used as the first and second read voltages, and any positive voltage may be used as the third voltage, as long as the level difference between the first read voltage and the third voltage, and the level difference between the second read voltage and the third voltage, is greater than the threshold voltage VTH and less than the critical write voltage VW.

Figure 10A:
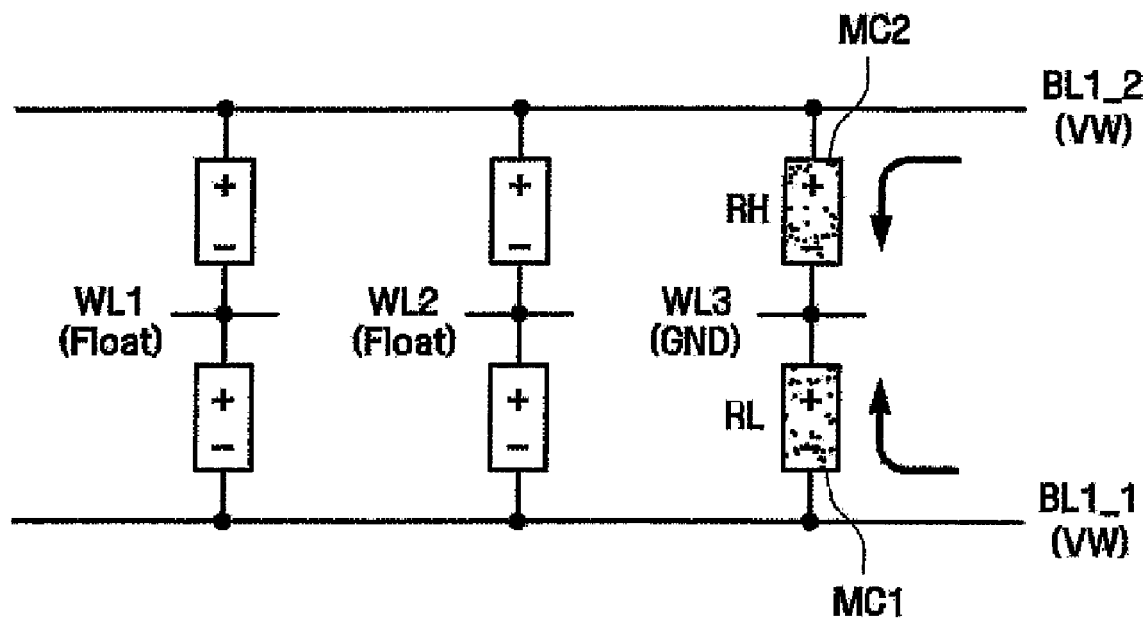
FIGS. 10A and 10B are conceptual views illustrating writing methods of a nonvolatile memory device, according to an exemplary embodiment of the present invention.
Figure 10B:
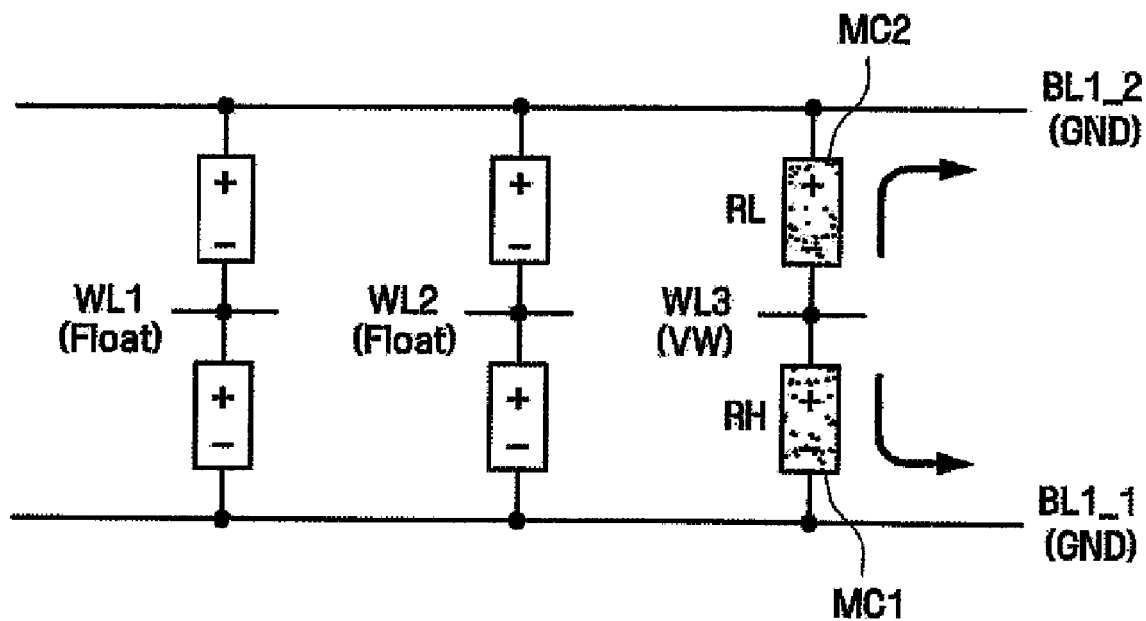
Figure 11A:
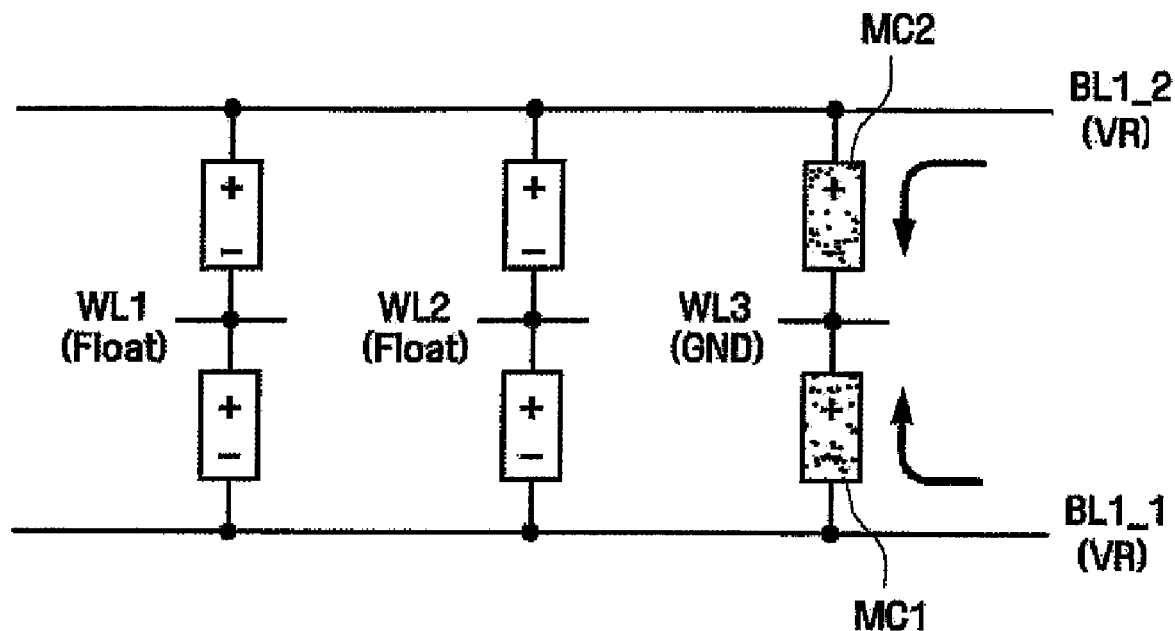
FIGS. 11A and 11B are conceptual views illustrating reading methods of a nonvolatile memory device, according to an exemplary embodiment of the present invention.
Figure 11B:
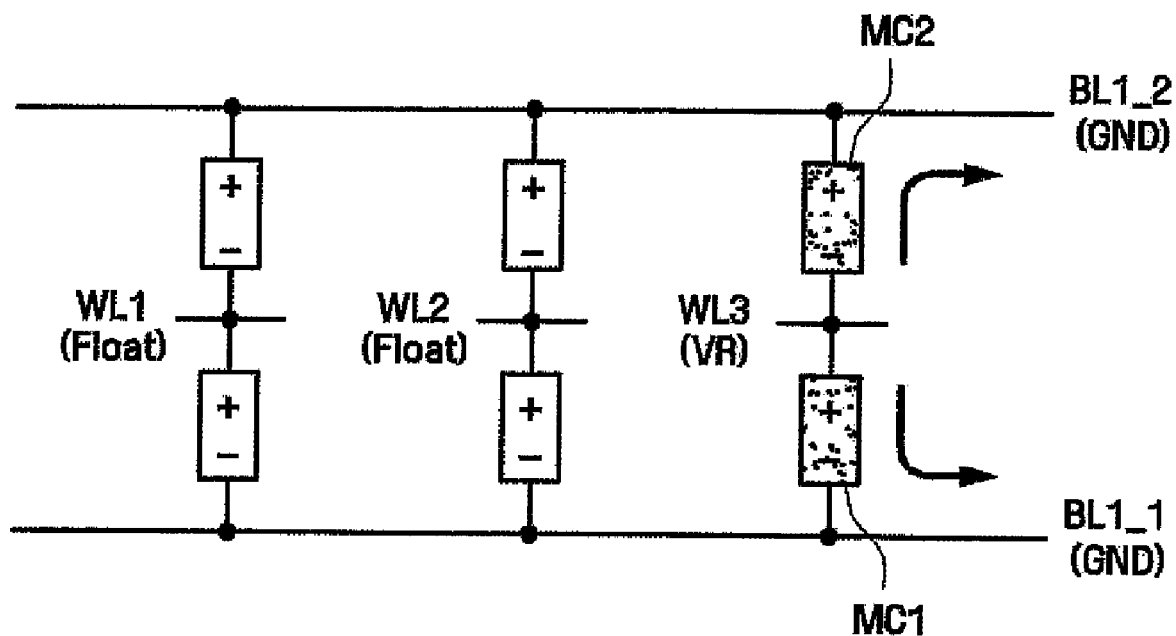

FIGS. 10A and 10B are conceptual views illustrating another writing method of a nonvolatile memory device, according to an exemplary embodiment of the present invention. FIGS. 11A and 11B are conceptual views illustrating another reading method of a nonvolatile memory device, according to an exemplary embodiment of the present invention. Like reference numerals refer to like elements in FIGS. 6A through 7B, and thus descriptions of these elements will not be repeated.

The write and the read methods of the nonvolatile memory device described in FIGS. 10A through 11B are substantially the same as the write and the read methods in FIGS. 6A through 7B, respectively, except that the word lines WL1, WL2 coupled to the non-selected twin memory cells are floated by the word line driver 125. Although not shown in the drawings, it would be apparent to one of ordinary skill in the relevant art that the word line driver 125 can float the word lines WL1, WL2, which are coupled with the non-selected twin memory cells in FIGS. 8A through 9B.

Figure 12:
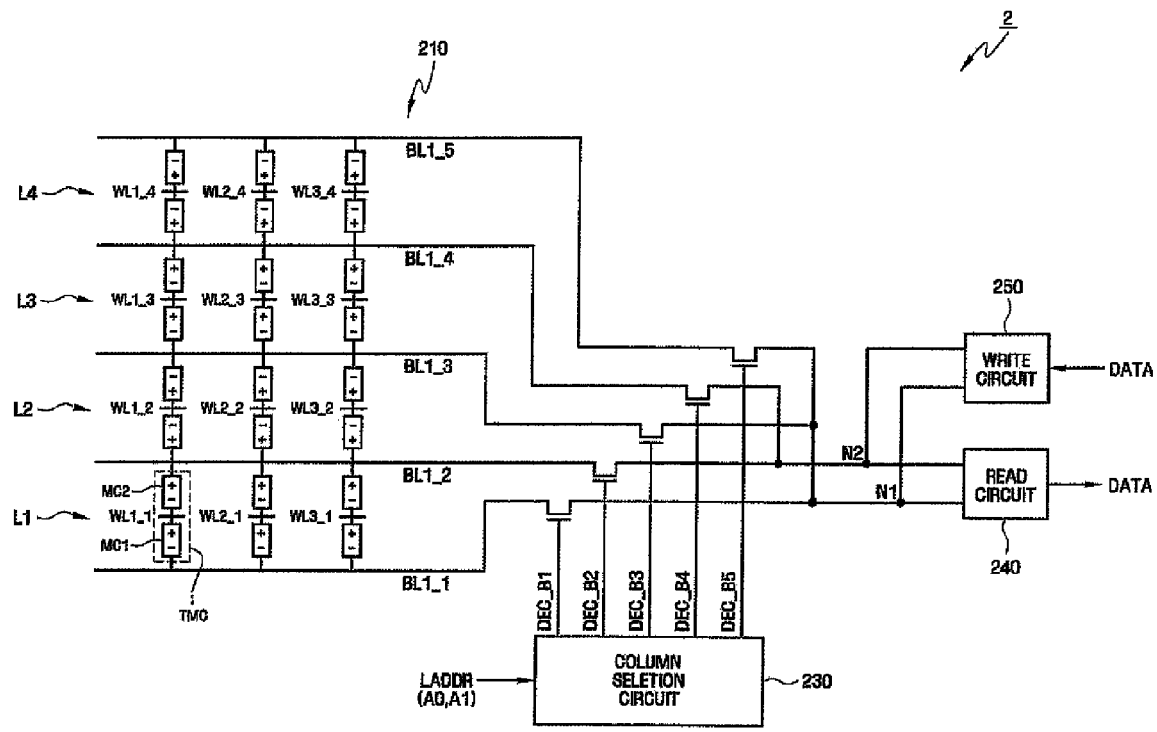
FIG. 12 is a block diagram illustrating a nonvolatile memory device, according to another exemplary embodiment of the present invention.

FIG. 12 is a block diagram illustrating a nonvolatile memory device, according to another exemplary embodiment of the present invention. Referring to FIG. 12, an illustrative nonvolatile memory device 2 includes a stacked memory cell array 210, a row selection circuit (not shown), a column selection circuit 230, a write circuit 250, a read circuit 240, and a word line driver (not shown).

In the stacked memory cell array 210, multiple memory cell layers L1-L4 are vertically stacked. Although four stacked memory cell layers L1-L4 are shown in FIG. 12, it is understood that the stacked memory cell array 210 is not limited to four layers. Each of the memory cell layers L1-L4 includes multiple twin memory cells TMC, and each of the twin memory cells TMC includes a first memory cell MC1 and second memory cell MC2 to store separate data, as described with respect to FIG. 1.

The stacked memory cell array 210 includes alternately vertically stacked multiple bit lines BL1_1-BL1_5 and multiple word lines WL1_1-WL3_4, such that the multiple bit lines BL1_1-BL1_5 are formed to extend in a first direction and the word lines WL1_1-WL3_4 are formed to extend in a second direction, which is different from the first direction. The multiple twin memory cells TMC are respectively located in areas defined by the intersections of the multiple bit lines BL1_1-BL1_5 and the multiple word lines WL1_1-WL3_4.

The kth ($1 \leq k \leq 4$, where k is integer) memory cell layer L1-L4 of the stacked memory cell array 210 includes multiple twin memory cells TMC, and each twin memory cell TMC includes a first memory cell MC1, which is coupled between the kth bit line and the kth word line, and a second memory cell MC2, which is coupled between the kth word line and the k+1th bit line. For example, the first memory cell layer L1 includes the first memory cell MC1 which is coupled between the first bit line BL1_1 and the first word line WL1_1 and the second memory cell MC2 which is coupled between the first word line WL1_1 and the second bit line BL1_2.

The polarities of the first and second memory cells MC1, MC2, which are formed in the same memory cell layer (for example, L1), are in the same direction. In another exemplary embodiment, multiple memory cell layers L1-L4 may include alternately stacked odd memory cell layers L1, L3 and even memory cell layers L2, L4. In this case, the polarities of the first and second memory cells MC1, MC2 of the twin memory cells TMC included in the odd memory cell layers L1, L3 and the polarities of the first and second memory cells MC1, MC2 of the twin memory cells TMC included in the even memory cell layers L2, L4 may be in different directions. For example, for the first and second memory cells MC1, MC2 of the twin memory cells TMC included in the odd memory cell layers L1, L3, a first polarity (+) may be provided to an upper end and a second polarity (−) may be provided to a lower end. In contrast, for the first and the second memory cells MC1, MC2 of the twin memory cells TMC included in the even memory cell layers L2, L4, the second polarity (−) may be provided to the upper end and the first polarity (+) may be provided to the lower end side.

In the depicted embodiment, the write circuit 250 and the read circuit 240 are shared by the multiple twin memory cells TMC in the multiple layers L1-L4. For example, the write circuit 250 and the read circuit 240 are coupled with a first node N1 and a second node N2. Also, the odd bit lines BL1_1, BL1_3, BL1_5 are coupled with the first node N1 and the even bit lines BL1_2, BL1_4 are coupled with the second node N2.

The column selection circuit 230 generates selection signals DEC_B1-DEC_B5 to select the two adjacent bit lines BL1_1-BL1_5 by decoding a layer address LADDR. TABLE 1 summarizes an exemplary operation of the column selection circuit 230.

TABLE 1

| LAYER ADDRESS (LADDR) | | SELECTION SIGNAL | | | | |
|---|---|---|---|---|---|---|
| A0 | A1 | DEC_B1 | DEC_B2 | DEC_B3 | DEC_B4 | DEC_B5 |
| 0 | 0 | 1 | 1 | 0 | 0 | 0 |
| 0 | 1 | 0 | 1 | 1 | 0 | 0 |
| 1 | 0 | 0 | 0 | 1 | 1 | 0 |
| 1 | 1 | 0 | 0 | 0 | 1 | 1 |

Referring to TABLE 1, when both A0 and A1 of the layer address LADDR are 0, for example, the selection signals DEC_B1, DEC_B2 are activated to select the two bit lines BL1_1, BL1_2. As a result, the selection signals DEC_B1, DEC_B2 turn on the coupled NMOS transistor. Also, when A0 and A1 are 0 and 1 respectively, for example, the selection signals DEC_B2, DEC_B3 are activated to select two bit lines BL1_2, BL1_3. As a result, the selection signals DEC_B2, DEC_B3 turn on the coupled NMOS transistor.

In other words, when the two adjacent bit lines are selected from among bit lines BL1_1 to BL_1_5, as explained with respect to FIGS. 6A through 11B, the write circuit 150 and the read circuit 140, and the word line driver can perform write or read operations with a predetermined voltage.

Further, in the nonvolatile memory device 2, according to another exemplary embodiment of the present invention, the polarity of the first and second memory cells MC1, MC2 of a twin memory cell TMC in the odd memory cell layers L1, L3 and the polarity of the first and the second memory cells MC1, MC2 of a twin memory cell TMC in the even memory cell layers L2, L4 are different each other. As a result, the same write voltage may be used to write to the twin memory cells in all the layers, and the same read voltage may be used to read data from the twin memory cells in all the layers.

For purposes of explanation, assume that the polarity of the first and second memory cells MC1, MC2 of a twin memory cell TMC in the odd memory cell layers L1, L3 and the polarity of the first and the second memory cells MC1, MC2 of a twin memory cell TMC in the even memory cell layers L2, L4 are the same. In this case, when the write circuit 250 supplies the twin memory cell TMC in the second layer L2 with voltage (for example, refer to FIG. 6A), which can write reset data to the twin memory cell TMC in the first layer L1, set data would be written into the twin memory cell TMC in the second layer L2. This is because the write circuit 150 and the read circuit 140 are coupled with the first node N1 and the second node N2, the odd bit lines BL1_1, BL1_3, BL1_5 are coupled with the first node N1, and the even bit lines BL1_2, BL1_4 are coupled with the second node N2. Therefore, in order to avoid this situation, the polarity of the first and the second memory cells MC1, MC2 in the odd memory cell layers L1, L3 and the polarity of the first and the second memory cells MC1, MC2 in the even memory cell layers L2, L4 are set to be different from each other.

Figure 13:
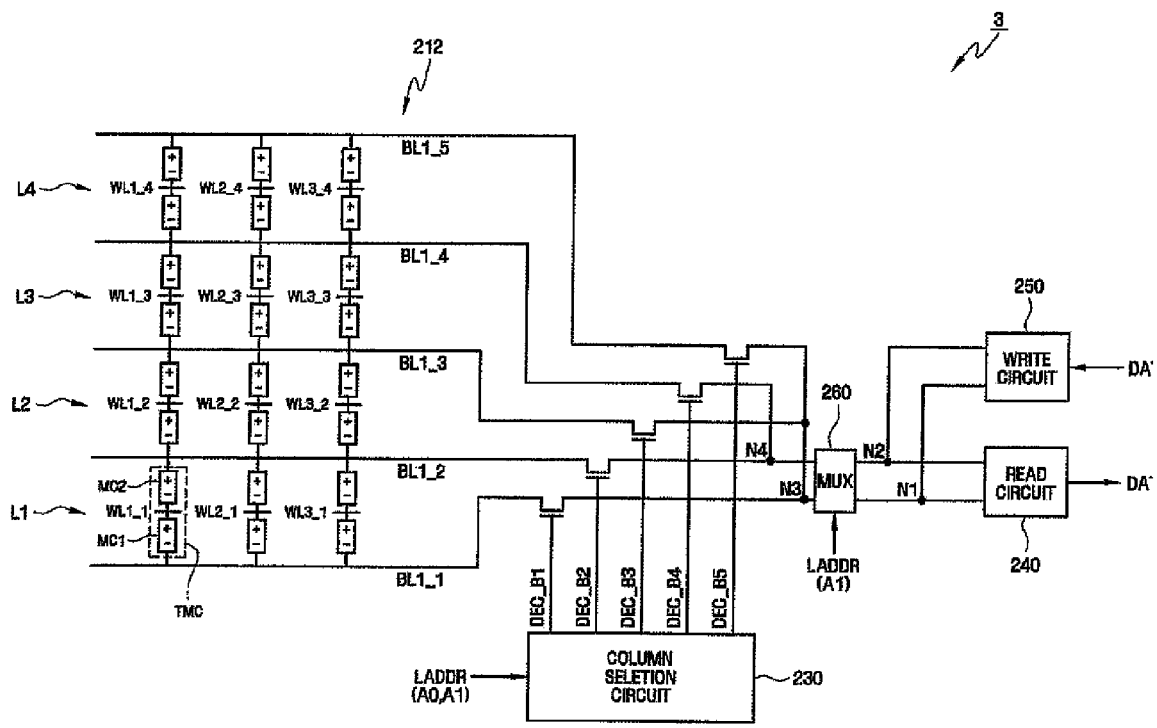
FIG. 13 is a block diagram illustrating a nonvolatile memory device, according to another exemplary embodiment of the present invention.
Figure 14A:
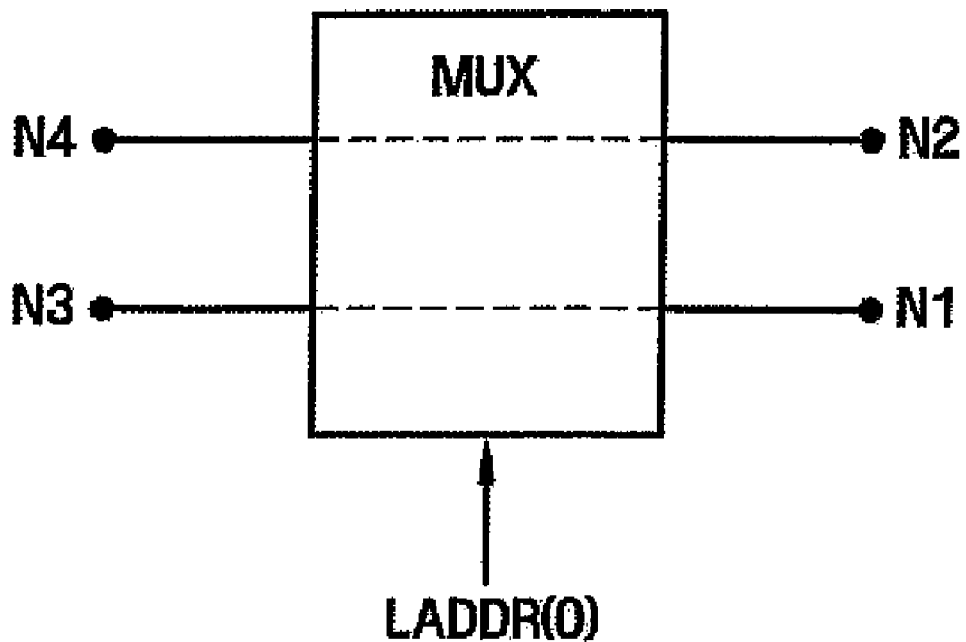
FIGS. 14A and 14B are block diagrams illustrating operation of a multiplexer, according to another exemplary embodiment of the present invention.
Figure 14B:
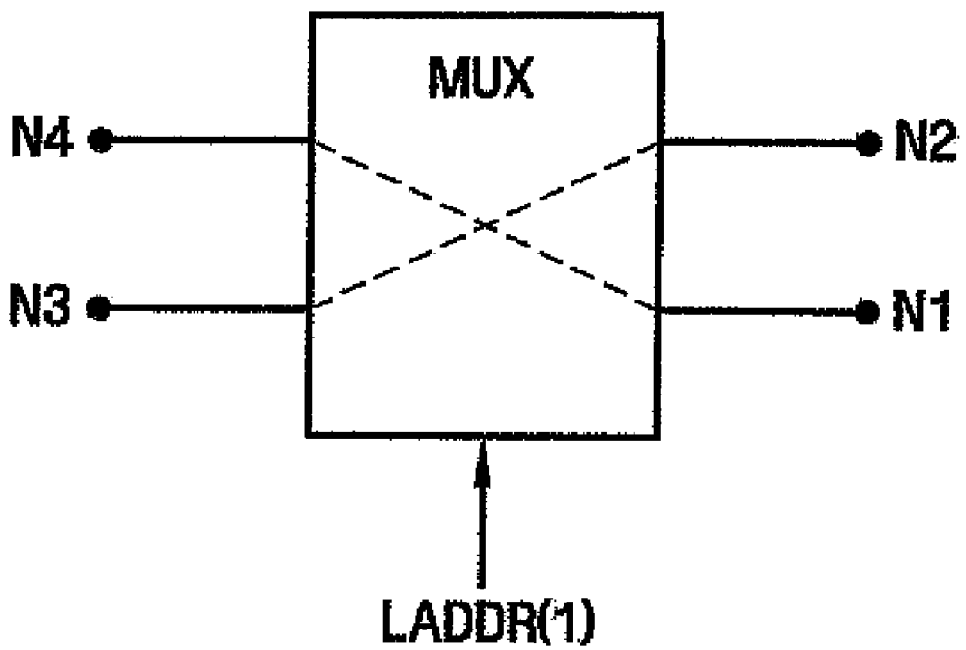

FIG. 13 is a block diagram illustrating a nonvolatile memory device, according to another exemplary embodiment of the present invention, and FIGS. 14A and 14B are block diagrams illustrating an operation of an exemplary multiplexer. Like reference numerals refer to like elements in FIG. 12, and thus the description of these elements will not be repeated.

Referring to FIG. 13, in the nonvolatile memory device 3, the multiple memory cell layers L1-L4 of stacked memory cell array 212 include alternately stacked odd memory cell layers L1, L3 and even memory cell layers L2, L4. The polarities of the first and second memory cells MC1, MC2 of a twin memory cell TMC included in the odd memory cell layers L1, L3, and the polarities of the first and second memory cells MC1, MC2 of a twin memory cell TMC included in the even memory cell layers L2, L4 are the same. For example, for each of the first and second memory cells MC1, MC2 of the twin memory cells TMC in the odd and the even memory cell layers L1-L4, the upper end may be given a first polarity (+) and the lower end may be given a second polarity (−).

A write circuit 250 and a read circuit 240 are shared with the twin memory cells TMC in the multiple layers L1-L4. For example, the write circuit 250 and the read circuit 240 are coupled with a first node N1 and a second node N2, respectively. Also, odd bit lines BL1_1, BL1_3, BL1_5 are coupled with a third node N3 and even bit lines BL1_2, BL1_4 are coupled with a fourth node N4.

In the depicted exemplary embodiment of the present invention, a multiplexer 260 is between the first and second nodes N1, N2 and the third and fourth nodes N3, N4. A selection signal (for example, a layer address LADDR) is supplied to the multiplexer 260. In this case, the layer address LADDR may be an A1 address, for example, as described with respect to FIG. 12. When the A1 address is 0, data may be written to the twin memory cell TMC in the odd memory cell layers L1, L3. As a result, as shown in FIG. 14A, the third and the fourth nodes N3, N4 are coupled with the first and the second nodes N1, N2, respectively. When the A1 address is 1, data may be written to the twin memory cell TMC in the even memory cell layers L2, L4. As a result, as shown in FIG. 14B, the third and the fourth nodes N3, N4 are coupled with the second and the first nodes N2, N1, respectively.

As described above, a nonvolatile memory device includes a twin memory cell. The reliability of a read operation may be improved since data stored in other memory cells are used as reference when reading data stored in one memory cell.

While the present invention has been shown and described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device comprising:
   a plurality of first bit lines extending in a first direction;
   a plurality of word lines formed on the plurality of the first bit lines, extending in a second direction different from the first direction;
   a plurality of second bit lines, formed on the plurality of the word lines, extending in the first direction; and
   a plurality of twin memory cells, each twin memory cell comprising a first memory cell coupled between a first bit line of the plurality of first bit lines and a word line of the plurality of word lines, and a second memory cell coupled between the word line and a second bit line of the plurality of second bit lines, wherein the first and second memory cells store different data.

2. The nonvolatile memory device of claim 1, wherein a polarity of the first memory cell is the same as a polarity of the second memory cell.

3. The nonvolatile memory device of claim 1, further comprising:
   a selection circuit for selecting a twin memory cell from the plurality of twin memory cells;
   a write circuit, coupled with the plurality of first bit lines and the plurality of second bit lines, for writing data to the selected twin memory cell;
   a read circuit, coupled with the plurality of first bit lines and the plurality of second bit lines, for reading data from the selected twin memory cell; and
   a word line driver, coupled with the plurality of word lines.

4. The nonvolatile memory device of claim 3, wherein the write circuit supplies a first bit line and a second bit line coupled with the selected twin memory cell with a first write voltage and a second write voltage, respectively; and
   the word line driver supplies a word line coupled with the selected twin memory cell with a first voltage, each of a first level difference between the first write voltage and the first voltage and a second level difference between the second write voltage and the first voltage being greater than or equal to a critical write voltage.

5. The nonvolatile memory device of claim 4, wherein first data is written to a first memory cell of the selected twin memory cell, and second data different from the first data is simultaneously written to a second memory cell of the selected twin memory cell, when each of the first write voltage and the second write voltage is positive, and the first voltage is a ground voltage; and wherein the second data is written to the first memory cell and the first data is written to the second memory cell when each of the first write voltage and the second write voltage is the ground voltage, and the first voltage is positive.

6. The nonvolatile memory device of claim 4, wherein first data is written to a first memory cell of the selected twin memory cell, and second data different from the first data is simultaneously written to a second memory cell of the selected twin memory cell, when each of the first write voltage and the second write voltage are positive, and the first voltage is negative; and wherein the second data is written to the first memory cell and the first data is written to the second memory cell when each of the first and the second write voltage is negative, and the first voltage is positive.

7. The nonvolatile memory device of claim 4, wherein the word line driver supplies the word line coupled with at least one non-selected twin memory cell with a second voltage; and each of a level difference between the first write voltage and the second voltage, and a level difference between the second write voltage and the second voltage, is less than the critical write voltage.

8. The nonvolatile memory device of claim 4, wherein the word line coupled with at least one non-selected twin memory cell is floated by the word line driver.

9. The nonvolatile memory device of claim 3, wherein the read circuit supplies a first bit line and a second bit line coupled with the selected twin memory cell with a first read voltage and a second read voltage, respectively; and wherein the word line driver supplies a word line coupled with the selected twin memory cell with a third voltage, each of a level difference between the first read voltage and the third voltage, and a level difference between the second read voltage and the third voltage, being greater than a threshold voltage and less than a critical write voltage.

10. The nonvolatile memory device of claim 9, wherein each of the first and second read voltages is positive, and the third voltage is negative or a ground voltage.

11. The nonvolatile memory device of claim 9, wherein each of the first and second read voltage is negative or a ground voltage, and the third voltage is positive.

12. The nonvolatile memory device of claim 9, wherein the word line driver supplies a word line coupled with at least one non-selected twin memory cell with a fourth voltage;

each of a level difference between the first read voltage and the fourth voltage, and a level difference between the second read voltage and the fourth voltage, is less than the threshold voltage.

13. The nonvolatile memory device of claim 9, wherein the word line coupled with the non-selected twin memory cell is floated by the word line driver.

14. The nonvolatile memory device of claim 1, wherein each of the first and second memory cells comprises a variable resistive element and a bi-directional access element.

15. A nonvolatile memory device comprising:

a stacked memory cell array comprising a plurality of vertically stacked memory cell layers, each of the memory cell layers comprising a plurality of twin memory cells, and each of the twin memory cells comprising a first memory cell and a second memory cell which store different data;

a selection circuit which selects a twin memory cell to be written to or read from the plurality of twin memory cells of at least one of the plurality of memory cell layers;

a write circuit which writes data to the selected twin memory cell; and a read circuit which reads data from the selected twin memory cell.

16. The nonvolatile memory device of claim 15, wherein the stacked memory cell array comprises 1 to n+1 bit lines and 1 to n word lines, where n is an integer;

the bit lines and the word lines are alternately and vertically stacked;

the bit lines extend in a first direction;

the word lines extend in a second direction different from the first direction; and the plurality of twin memory cells are located at intersections of the bit lines and the word lines.

17. The nonvolatile memory device of claim 16, wherein the stacked memory cell array further comprises n vertically stacked memory cell layers; and wherein a kth memory cell layer ($1 \leq k \leq n$, where k is an integer) comprises a plurality of twin memory cells, each twin memory cell comprising a first memory cell coupled between the kth bit line and the kth word line, and a second memory cell coupled between the kth word line and the (k+1)th bit line.

18. The nonvolatile memory device of claim 17, wherein a polarity of the first memory cell and a polarity of the second memory cell in each twin memory cell located in the same memory cell layer are the same; and wherein the polarity of first and second memory cells of a twin memory cell in an ath memory cell layer ($1 \leq a \leq n$, where a is an odd number), and the polarity of first and second memory cells of a twin memory cell located in a bth memory cell layer ($1 \leq b \leq n$, where b is an even number) are different from each other.

19. The nonvolatile memory device of claim 18, wherein the write circuit and the read circuit are coupled with first and second nodes;

an ath bit line is coupled with the first node; and a bth bit line is coupled with the second node.

20. The nonvolatile memory device of claim 17, wherein a polarity of the first memory cell and a polarity of the second memory cell in each twin memory cell located in the same memory cell layer are the same; and wherein the polarity of the first and second memory cells of a twin memory cell in an ath memory cell layer ($1 \leq a \leq n$, where a is an odd number), and the polarity of the first and second memory cells of a twin memory cell located in a bth memory cell layer ($1 \leq b \leq n$, where b is an even number) are the same.

21. The nonvolatile memory device of claim 20, further comprising:

a multiplexer located between first and second nodes and third and fourth nodes, the multiplexer coupling the third and fourth nodes with the first and second nodes, respectively, or the third and fourth nodes with the second and first nodes, respectively, based on a selection signal, wherein the write circuit and the read circuit are coupled with first and second nodes, an ath bit line is coupled with the third node, and a bth line is coupled with the fourth node.

22. The nonvolatile memory device of claim 21, wherein the selection signal comprises a layer address.

* * * * *